(12) United States Patent
Asnaashari (10) Patent No.: US 8,526,234 B1
(45) Date of Patent: Sep. 3, 2013

(54) CONTROLLER MANAGEMENT OF MEMORY ARRAY OF STORAGE DEVICE USING MAGNETIC RANDOM ACCESS MEMORY (MRAM)

(71) Applicant: Avalanche Technology, Inc., Fremont, CA (US)

(72) Inventor: Mehdi Asnaashari, Danville, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/708,582

(22) Filed: Dec. 7, 2012

Related U.S. Application Data (63) Continuation-in-part of application No. 13/679,739, filed on Nov. 16, 2012.

(51) Int. Cl.
*G11C 11/34* (2006.01)
*G11C 16/06* (2006.01)

(52) U.S. Cl.
USPC 365/185.17; 365/158; 711/103; 711/E12.008

(58) Field of Classification Search
USPC ............ 365/185.17, 158; 711/103, E12.008
See application file for complete search history.

(56) References Cited

U.S. PATENT DOCUMENTS

| | | | |
|---|---|---|---|
| 2010/0082890 A1* | 4/2010 | Heo et al. | 711/103 |
| 2012/0144102 A1* | 6/2012 | Langlois et al. | 711/103 |

* cited by examiner

*Primary Examiner* — Toan Le
(74) *Attorney, Agent, or Firm* — Maryam Imam; IPxLaw Group LLP (57) ABSTRACT

An embodiment of the invention includes a mass storage device with a storage media that includes magnetic random access memory (MRAM) devices with a NAND flash interface and NAND flash memory devices that are coupled to the MRAM devices. The storage media is partitioned into a hybrid reserved area made of a combination of MRAM array NAND array and hybrid user area made of a combination of MRAM array and NAND array and further includes a controller with a host interface and flash interface coupled to the MRAM and NAND flash memory devices through a flash interface.

25 Claims, 7 Drawing Sheets

CONTROLLER MANAGEMENT OF MEMORY ARRAY OF STORAGE DEVICE USING MAGNETIC RANDOM ACCESS MEMORY (MRAM)

CROSS REFERENCE TO RELATED APPLICATIONS

This application is a continuation-in-part of U.S. patent application Ser. No. 13/679,739, filed by Mehdi Asnaashari, on Nov. 16, 2012, and entitled "HOST-MANAGED LOGICAL MASS STORAGE DEVICE USING MAGNETIC RANDOM ACCESS MEMORY (MRAM)".

BACKGROUND OF THE INVENTION

1. Field of the Invention

The invention relates generally to a storage device and particularly to management of the memory array of storage device by a controller.

2. Description of the Prior Art

Memory media in a mass storage device is used partially by the controller of the device to store a variety of types of private data, i.e. data that is not intended for public access and is rather intended for a very limited access, in the memory media, that are critical to the device's performance and reliability. Examples of such data include boot code and tables, among others. The controller uses the rest of the memory media to store data from a host. Some of the data from the host are frequently accessed and are also critically important to the performance of the host incorporating the mass storage device. Hence the controller's efficient management of these data is most critical in optimizing the mass storage device's performance as well as providing pleasant user experience.

Controller private data, such as boot code, is not very large compare with user data but it requires a reliable storage media. Another example of private data is tables that are managed by the controller to locate logical block addresses within the memory array physical block addresses. These tables are most critical to functionality and performance of the device and are frequently accessed, as such they require media with high performance, reliability, and non volatility.

Controllers sometimes store security parameters such as AES keys in their private data area which also requires reliable media. The security keys are used to protect the data of the memory array (part of the memory media) of the mass storage device. Any corruption of the keys will most likely render the storage device useless.

Certain host parameters, such as file allocation table (FAT) and directories are accessed and updated frequently as well and require a memory media type with high performance and high reliability for optimal performance. Other types of host data such as pictures, songs and movies typically require a very large amount of storage and occupy the majority of the memory media of the storage device but they do not require as reliable nor high performance by the memory media.

Current mass storage devices commonly utilize NAND flash memories for the storage media. NAND memories provide large amounts of storage at a reasonable price point but they fail to provide all the attributes required by the controller for achieving high performance and reliable system. NAND flash memories are inherently slow with limited reliability and endurance which makes them unattractive for controllers requiring those attributes.

NAND flash memory is a block-based non-volatile memory with each block organized into and made of various pages. After a block is programmed, it is erased prior to programming it again. Most flash memory requires sequential programming of pages within a block. Another limitation of flash memory is that blocks can be erased for a limited number of times, thus frequent erase operations reduce the life time of the flash memory. Accordingly, flash memory does not allow for in-place updates. That is, it cannot simply overwrite existing data with new data. The new data are written to an erased area (out-of-place updates) only, and the old data are invalidated for reclamation in the future. This out-of-place update causes the coexistence of invalid (i.e. outdated) and valid data in the same block. "Garbage collection", as is well known to those in the art, is a process referred to in reclaiming the space occupied by invalid data and where valid data is moved to a new block and the old block is erased. Garbage collection generally and undesirably results in significant performance overhead as well as unpredictable operational latency.

As mentioned above, flash memory blocks can be erased for a limited number of times. Wear leveling is the process commonly employed to improve flash memory life time by evenly distributing erases over the entire flash memory (within a band). A typical Multi Level Cell_ (MLC) NAND flash manufactured using 25 nano meter technology typically has a program/erase (PE) cycle in the range of 1500 to 3000 cycles. They require erasing prior to being programmed with typical programming time or duration being approximately 10 milli seconds (ms) and a program time for programming a 4 to 8 Kilo Byte page being approximately 1 to 2 ms.

Moreover, NAND flash memories are organized in large page sizes of 8 KB and 16 KB and block sizes of 512 KB to 1 MB. Large page size attribute of flash memories makes it undesirable for small I/O operations since the whole page has to be programmed in its entirety. Programming a partial page requires merging of the existing data on the page with the new data and writing it to a new page. The old page will no longer contain valid data and has to be reclaimed eventually. Since the data corresponding to the same logical address is written to a different physical address, controller has to also maintain a table that maps the logical address to the physical address.

NAND flash memories, despite all their deficiencies, are nevertheless the preferred medium of choice for solid state mass storage devices because of their capacity to save large amounts of data at reasonable prices.

As such, to enhance user experience yet achieve cost effectiveness, its best to complement NAND flash memories with higher performance, reliability and endurance and perhaps more expensive types of media such as MRAM in the same mass storage device. This allows the controller to optimize its performance, reliability, and user experience by using the higher grade media to store its critical data and host system data and using the NAND flash memories to store host non-critical data.

The controller may divide the MRAM array of the mass storage device into a number of partitions and assign them to its private area or user area and utilize them accordingly.

What is needed is a storage device that takes advantage of the use of different types of memories, such as NAND and MRAM, and is reliable, efficient, yet cost-effective.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the invention includes a mass storage device with a storage media that includes magnetic random access memory (MRAM) devices with a NAND flash interface and NAND flash memory devices that are coupled to the MRAM devices. The storage media is partitioned into a hybrid reserved area made of a combination of MRAM array NAND array and hybrid user area made of a combination of MRAM array and NAND array and further includes a controller with a host interface and flash interface coupled to the MRAM and NAND flash memory devices through a flash interface.

These and other objects and advantages of the present invention will no doubt become apparent to those skilled in the art after having read the following detailed description of the preferred embodiments illustrated in the several figures of the drawing.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

As will become evident, in some embodiments of the invention, MRAM and NAND Flash memories are combined in a mass storage device. Currently, MRAM devices are more costly than NAND flash memories and fail to provide the capacities that NAND flash memories offer but they are much faster than NAND flash with better reliability and endurance. As such, MRAM devices can be used by controllers to store their critical data requiring such attributes. NAND flash memories can provide large amount of storage at a lower cost and it can be used by controllers for storing user data from hosts which require large amount of capacity with lower performance, reliability and endurance. Examples of critical data are controller's boot code, tables and data cache and host's File allocation table, and directories and so on and examples of non-critical data are pictures, movies, videos, and so on.

MRAM devices are more expensive than NAND flash memories but they are much faster than NAND flash with better reliability and endurance and they can be used to store critical data requiring such attributes. NAND flash memories can provide large amounts of storage at a lower cost for storing user area which requires larger capacity with lower performance, reliability and endurance.

Figure 1:
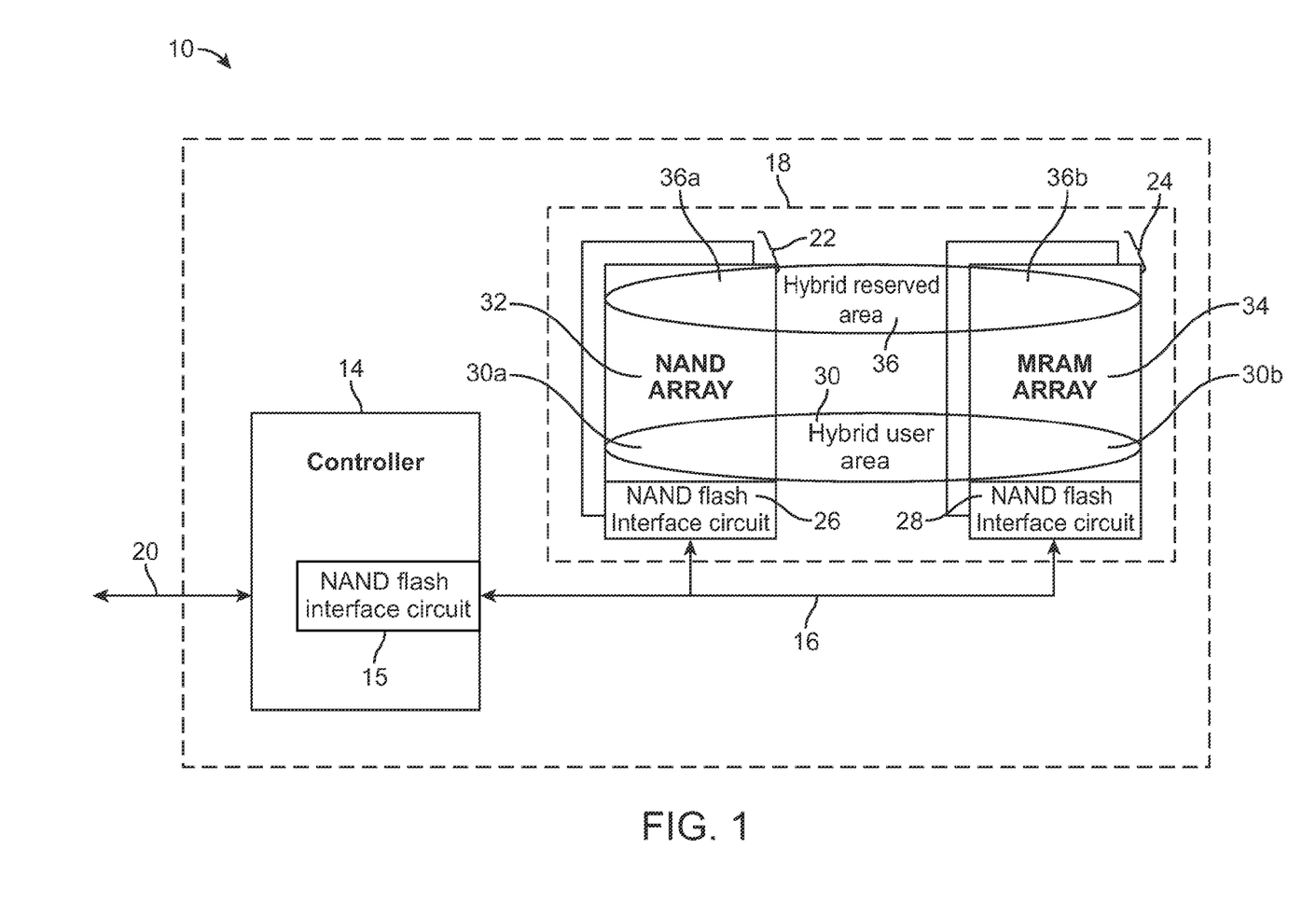
FIG. 1 shows a mass storage device 10, in accordance with an embodiment of the invention.

FIG. 1 shows a mass storage device 10, in accordance with an embodiment of the invention. The device 10 is shown to include a controller 14 with NAND flash interface circuit 15 and host interface 20, a flash interface 16, and a storage media 18. The controller 14 is shown coupled to the storage media 18 through the flash interface 16. The controller 14 is shown to include a NAND flash interface circuit 15.

The controller 14 can selectively utilize the different memories in the media for storing different type of data and that is used primarily by the controller 14 to manage the devices 22 and 24.

The storage media 18 is shown to include a number of NAND flash memory devices 22 and a number of magnetic random access memory (MRAM) devices 24. The storage media 18 includes hybrid reserved area 36 that is a combination of some portion of NAND array 32 and some portion of MRAM array 34. The storage media 18 also includes hybrid user area 30 that is a combination of some portion of NAND array 32 and some portion of MRAM array 34. The devices 22 is shown to include a NAND flash interface circuit 26 and NAND array 32. The NAND array 32 of storage media 18 includes the NAND portion 36a of hybrid reserved area 36 and the NAND portion 30a of hybrid user area 30. The devices 24 is shown to include a NAND flash interface circuit 28, MRAM array 34, and MRAM array 34 of storage medias 18 includes the MRAM portion 36b of hybrid reserved area 36 and the MRAM portion 30b of hybrid user area 30.

The hybrid reserved area 36 spans the MRAM devices 24 and the NAND flash memory devices 22 with the MRAM portion 36b being a portion of the MRAM devices 24 and the NAND portion 36a being a portion of the NAND flash memory devices 22. Similarly, the hybrid user area 30 spans the MRAM devices 24 and the NAND flash memory devices 22 with the MRAM portion 30b being a portion of the MRAM devices 24 and the NAND portion 30a being a portion of the NAND flash memory devices 22.

Alternatively, the hybrid reserved area 36 may be entirely a part of the MRAM portion 36b. Similarly, in alternative embodiments, the hybrid user area 30 is entirely a part of the MRAM portion 30b. In the case where both the hybrid reserved area 36 and the hybrid user area 30 are both entirely a part of the MRAM devices 24, there is no need for the NAND devices 22.

The hybrid reserved area 36 is used to store information that is private data or data that is inaccessible to a user of the device 10. Examples of private data include boot code, system data, Meta data, or tables.

Based on apriory information regarding the identity of a host that is to use the device 10, the controller 14 advantageously decides to store host-provided and host-critical data in the MRAM portion of the hybrid user area 30. An example of this is in the case of a file allocation table (FAT) file system, such as FAT16 or FAT 32, where the controller 14 stores the master boot record (MBR), partition boot record (PBR), FATS, and directories, all of which are frequently-accessed information and intended for lower logical block access (LBA) range of addresses, in the area 30b.

In the embodiment of FIG. 1, storage media 18 provides two types of memory devices with each having distinct and complementary attributes with MRAM devices 24 being very high performance and reliable and NAND flash memory devices 22 providing the majority of the capacity for the storage media 18.

To simplify integration of MRAM and NAND flash into a single device, MRAM device requires an interface that is compatible with the NAND flash interface. Furthermore, most of the existing embedded mass storage controllers such as USB, MMC, and SD only support memories with NAND flash interface without any modification to the controller. Therefore, a MRAM device with NAND flash interface can be readily integrated with an existing controller and NAND flash memories to create a mass storage device with different media types to address different system requirements.

MRAM memories will make up the very high performance and reliable portion of the memory media of the storage device and can be used by the controller for storing data requiring such attributes. NAND flash memory portion of the memory media can be used by the controller for storing user area and data types that do not have such stringent requirements.

While MRAM is fast and reliable, it does not require erasure prior to being written with a new data. As such, management of data in the MRAM portion of the memory media can be greatly simplified. Controller will no longer have to perform garbage collections and mapping of that portion of the memory media which will further improve the performance of the system utilizing these storage devices.

It would also improve the performance of small IO operations since the data can be written over the existing data and thus eliminating the merge and eventual GC process.

Another advantage of having MRAM on the memory media is to store the metadata information. In most controller architecture such as SATA and mSATA, an external DRAM with either DDR2 or DDR3 interface is used to store the metadata information to improve the system performance. Due to the nature of MRAM, the controller can use the MRAM portion of the memory media to store metadata information and eliminate the controller cost associated with DDR interface as well as the external DRAM component.

Other controllers such as USB and MMC/eMMC that typically do not require the external DRAM use NAND flash for storing the metadata information. These controllers can also use the MRAM portion of the memory media and further improve system performance.

MRAM having an interface compatible with NAND flash memories becomes transparent to the controllers already having the NAND interface and with minor modifications to the firmware in the area of write, garbage collections, and metadata management due to the MRAM portion of the memory media, system performance will increase substantially.

The MRAM portion 36b can also be used by the controller 14 to cache host data or data provided by a host. Controller 14 can write the host data in response to host write command to the MRAM portion 36b and inform the host that the write command has completed. The controller 14 can then, at its convenience, find an available physical location within the hybrid user area 30 and move the host data from the MRAM portion 36b to the hybrid user area 30, which advantageously reduces the command completion latency substantially. In the event, there is no available physical location in the hybrid user area 30, the controller 14 performs 'garbage collection' to make available space for storing information in the hybrid user area 30 prior to moving host data from the MRAM portion 36b into the hybrid user area 30. In the meanwhile, if the host wishes to read data that the controller 14 has saved in the hybrid reserved area 36 but not yet moved to the hybrid user area 30, the controller 14 knows to access this data only from the hybrid reserved area 36. Thus, host data coherency is maintained.

In another embodiment of this invention, the controller 14 may also use the MRAM portion 36b to collect enough host data to perform a NAND flash full page program operation. As is well known, in a NAND flash full page program operation, when host IO operations are smaller than a page program unit of the NAND flash memory, a controller has to either perform partial page programming, which involves merging of the old data with the new data and is time consuming or save the data in its volatile SRAM/DRAM buffer and wait for additional commands from the host until there is enough data to perform a page program operation. Meanwhile, the controller cannot send the command completion to the host since the host data has not yet written to a persistent media. The process of merging of the old data with the new data requires reading of the old data and appending the new data to the read old data and writing this, in its entirety, to another physical location within the NAND flash memory device, which is not only time consuming and effects performance of the device but it also increases the number of NAND flash program/erase operation and adversely effects NAND flash reliability and endurance. In the meanwhile, if the host wishes to read data that the controller 14 has saved in the reserved area MRAM portion 36b but not yet moved to the hybrid user area 30, the controller 14 knows to access this data only from the reserved area MRAM portion 36b. Thus, host data coherency is maintained.

The foregoing problem is minimized in the various embodiments of the invention, by using the MRAM portion 36b for caching host data, which substantially improves command latency and system reliability particularly in systems with lots of small IO operations because of the persistent characteristic of MRAMs.

In some embodiments of the invention, as discussed and shown herein, MRAM memories are mapped into controller's reserved area and provide very high performance and reliable media for controller's critical parameters requiring such characteristics. NAND flash memories can also be mapped into user area and be used for user data and data types that do not such stringent requirements. A combination of MRAM and NAND flash memories can also be mapped into a hybrid user area and hybrid reserved area and be used for systems that only require high reliability and performance for some of the data being stored on it. Controller will use the media type for storing its parameters and host data, based on their attributes.

Figure 2:
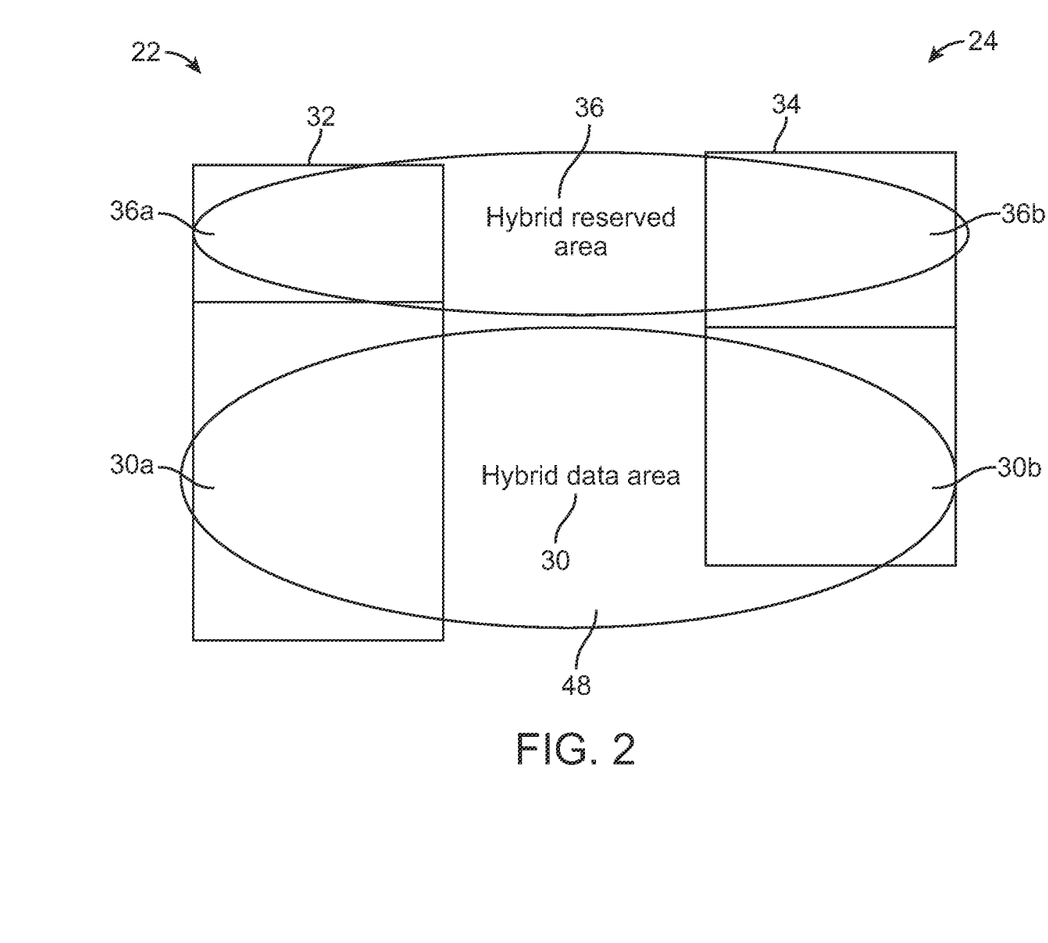
FIG. 2 shows further details of the hybrid reserved area 36 and hybrid user area 30, in accordance with another embodiment of the invention.

FIG. 2 shows further details of the physical representation of the NAND array 32 of NAND flash memory devices 22 and the MRAM array 34 of MRAM devices 24. The NAND array 32 of storage media 18 includes the NAND portion 36a of hybrid reserved area 36 and the NAND portion 30a of hybrid user area 30. The MRAM array 34 of storage media 18 is shown made of the NAND portion 36b of hybrid reserved area 36 and the MRAM portion 30b of hybrid user area 30 in accordance with another embodiment of the invention. The hybrid reserved area 36 and the hybrid user area 30 may be constructed of different combination of the MRAM portion 36b and 30b respectively and the NAND portion 36a and 30a.

Figure 3:
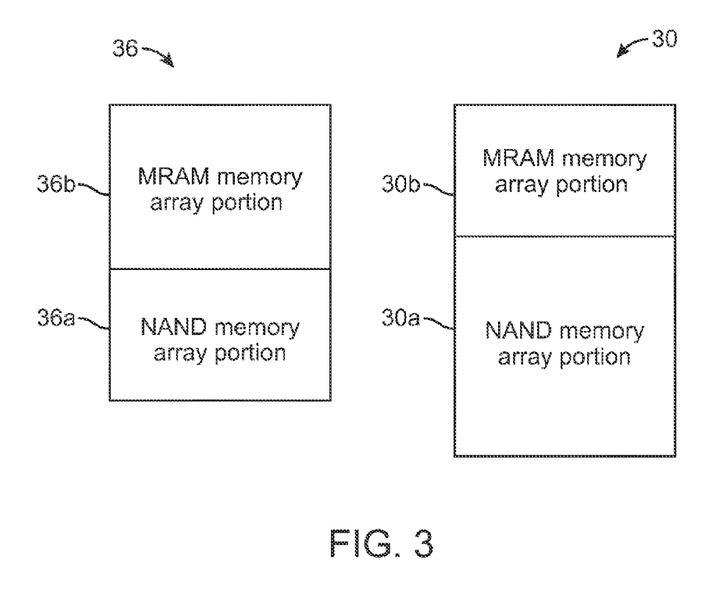
FIG. 3 shows an exemplary logical representation of hybrid reserved area 36 and hybrid user area 30, in accordance with an embodiment of the invention.

FIG. 3 shows an exemplary logical representation of memory arrays of hybrid reserved area 36 and hybrid user area 30 FIG. 2. The hybrid reserved area 36 is made of mixed memory array; the MRAM portion 36b and the NAND portion 36a and provides a mixed attribute reserved area to the controller 14 for storing its data. The hybrid user area 30 is made of mixed memory array; the MRAM portion 30b and the NAND portion 30a and provides a mixed attribute user area to the controller 14 for storing host data.

Figure 4:
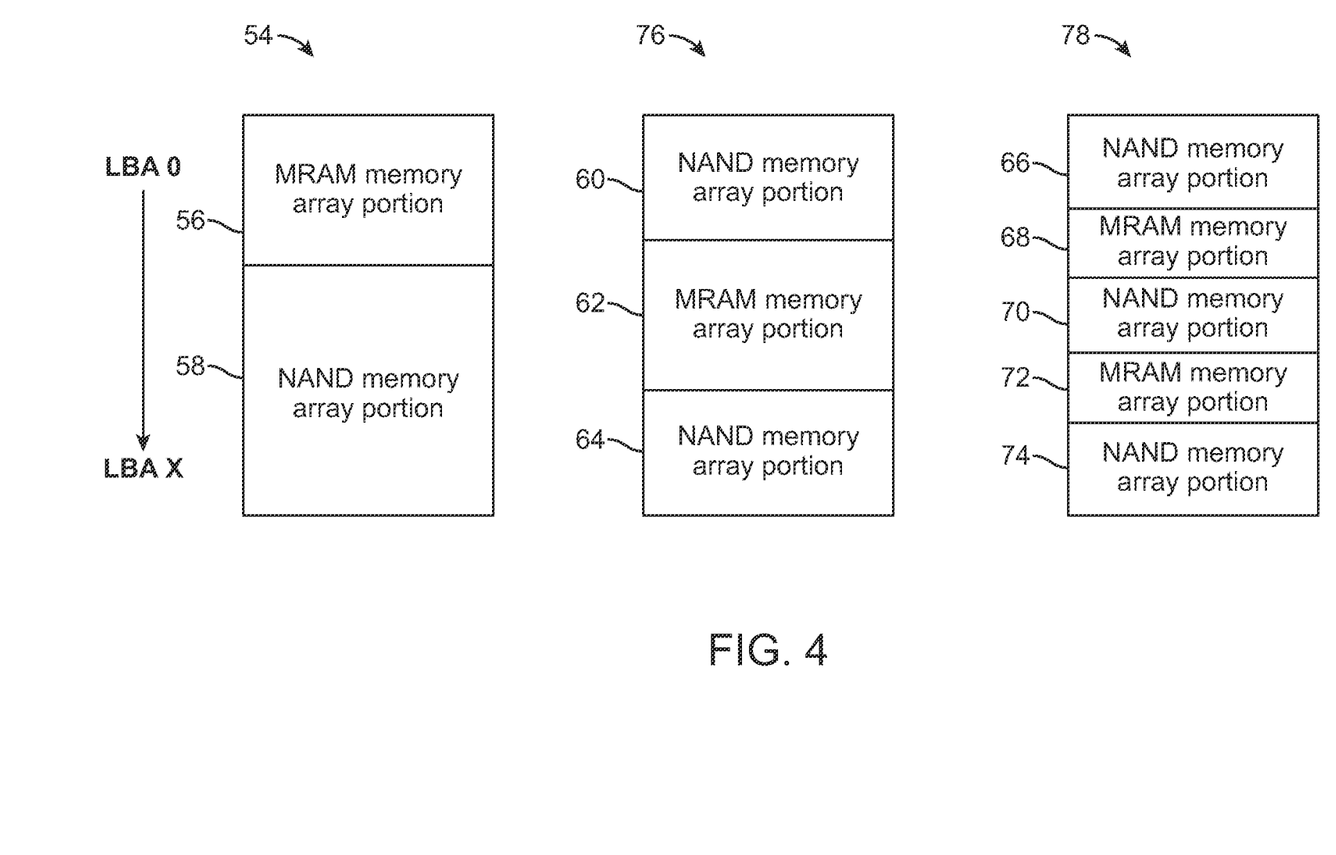
FIG. 4 shows exemplary logical representation of hybrid user area 30, in accordance with an embodiment of the invention.

FIG. 4 shows exemplary logical representation of different type of memory arrays of hybrid user area, in accordance with an embodiment of the invention. Each of the hybrid user area 54, 76, and 78 may be the hybrid user area 30 of FIG. 1. In FIG. 4, the hybrid user area 54 is shown to include the MRAM memory array portion 56 on the lower logical block addresses (LBAs) and the NAND memory array portion 58 at the higher LBAs. The hybrid user area 76 is shown to include the MRAM memory array portion 62 in the middle of the LBA range and two NAND memory array portions 60 and 64 at the lower and the higher LBA range in accordance with another embodiment of the invention. The hybrid user area 78 is shown to include two MRAM memory array portions 68 and 72 at two different LBA ranges and three NAND memory array portions 66, 70 and 74 at the lower, middle and upper LBA range. These exemplary logical representations of different memory arrays of a hybrid user area are to demonstrate that the user area may of any size and combination of MRAM and NAND memory arrays. Furthermore, MRAM memory array portion and NAND memory array portion of hybrid user area may be any size and occupy various portion of the hybrid user area logical address space range.

Figure 5:
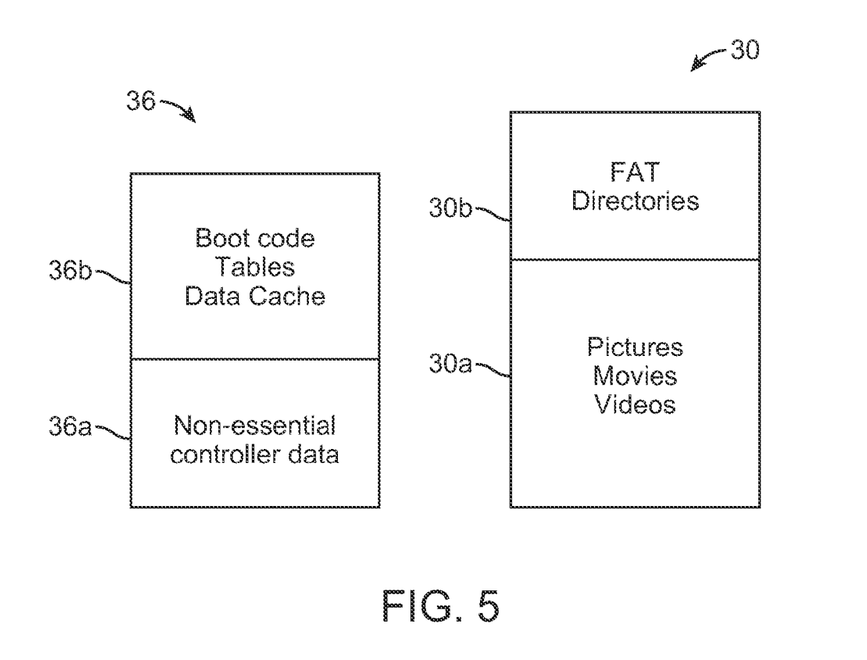
FIG. 5 shows exemplary types of data stored in each of the hybrid user area 30 and hybrid reserved area 36, in accordance with an embodiment of the invention.

FIG. 5 shows exemplary types of data stored by the controller 14 in memory arrays of each of the hybrid reserved area 36 and hybrid user area 30, in accordance with an embodiment of the invention. The MRAM portion 36b of hybrid reserved area 36 is shown, as an exemplary embodiment, to include the boot code, tables and data cache which are frequently accessed by the controller and effect system performance and the NAND portion 36a of the hybrid reserved area 36 is shown for example to include non-essential controller data. The MRAM portion 30b of hybrid user area 30 is shown for example to include FAT and directories which are frequently accessed by the host and effect system performance and the NAND portion 30a of the hybrid user area 30 is shown for example to include data from host such as pictures, movie, and videos.

Figure 6:
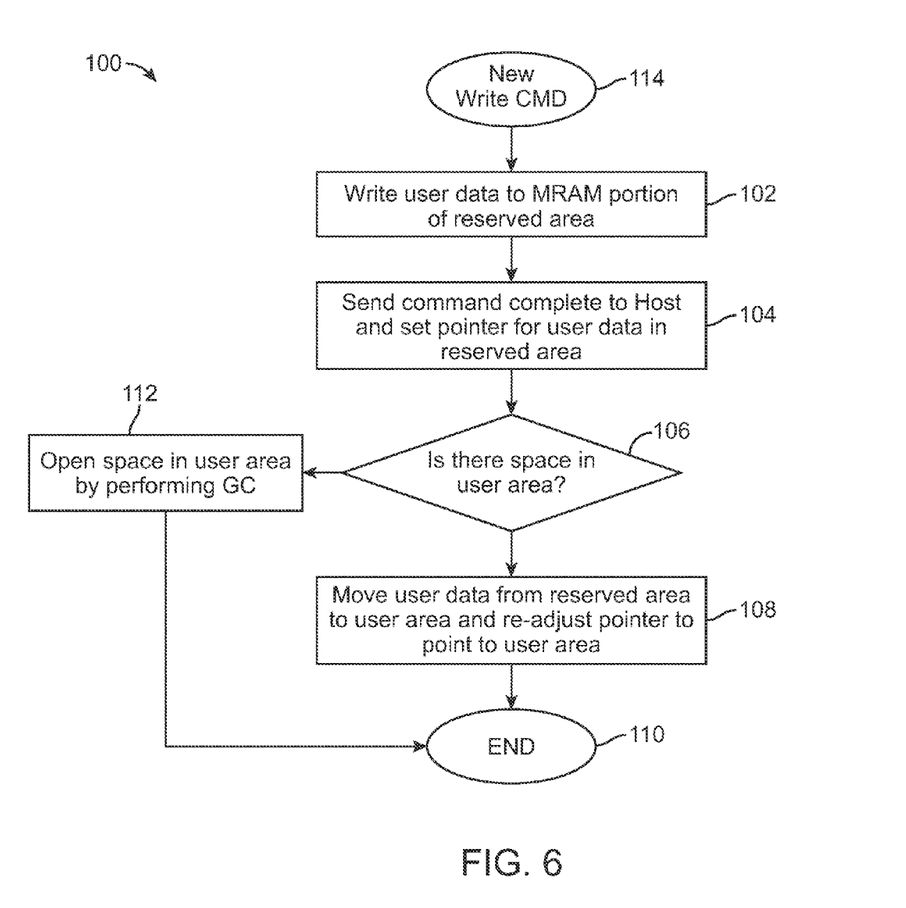
FIG. 6 shows a flow chart of the steps performed by the mass storage device 10, in accordance with a method of the invention.

FIG. 6 shows a flow chart 100 of the steps performed by the mass storage device 10, in accordance with a method of the invention. The steps of FIG. 6 are generally performed by the controller 14 (FIG. 1). At step 114, a write command to a LUN, typically provided by the host, is received by the controller 14 followed by the user data. At step 102, the user data received by the controller 14 is written to the MRAM portion of the reserved area of the device 24, or MRAM portion 36b. Next, at step 104, a command is sent by the controller 14 to the host through the host interface 20 indicating completion of the writing in step 102 and a pointer is set identifying the location of the user data being in MRAM portion 36b.

Next, at 106, a determination is made by the controller 14 as to whether or not available space remains in the LUN that the user data was intended for. If not, the process continues to step 112 where space in the intended LUN is freed up by the controller 14 by performing garbage collection, and if so, the process moves onto the step 108.

At step 108, user data is moved from the MRAM portion 36b to the intended LUN and the pointer of step 104 is re-adjusted to point to the location in the LUN where the user data has been moved, and the process ends at 110.

Figure 7:
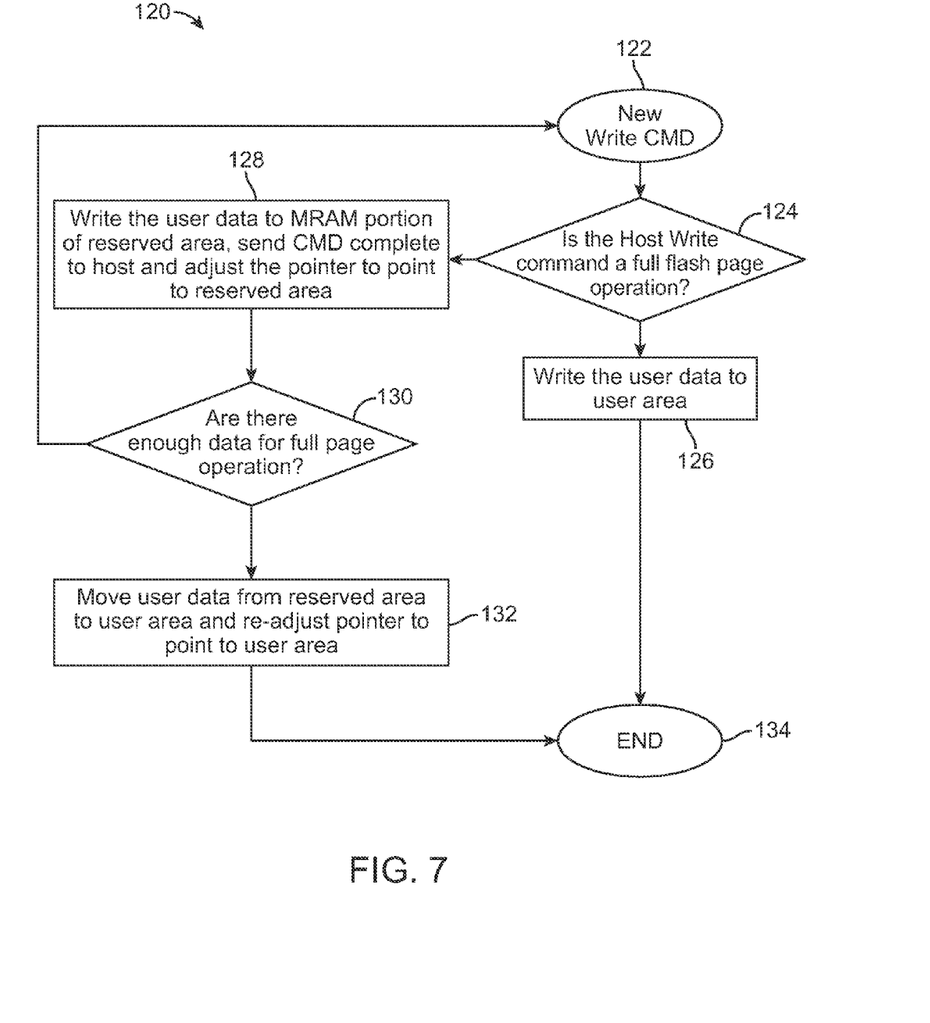
FIG. 7 shows a flow chart of the steps performed by the mass storage device 10, in accordance with a method of the invention.

FIG. 7 shows a flow chart 120 of the steps performed by the mass storage device 10, in accordance with a method of the invention. At step 122, a new write command to a LUN is received from a host by the controller 14 followed by user data. Next, a determination is made at 124 as to whether or not the host write command, received by the controller 14 at step 122, is a write to a full-flash page, i.e. full-flash page operation. If so, the user data is written to the intended LUN and the process ends at step 134.

If the host write command is not a full-flash page, the process continues to step 128 where user data is written to the reserved area MRAM portion 36b and a command complete is sent to a host, by the controller 14, such as done at step 102 of FIG. 6 and a pointer is set identifying the location of the user data being in MRAM portion 36b.

Next, at 130, a determination is made as to whether or not enough data is been collected in the reserved area MRAM portion for a full-page operation. If so, user data is moved from the MRAM portion 36b to the intended LUN and the pointer of step 128 is re-adjusted to point to a location in the LUN where the user data has been moved, and the process ends at 134. If there is not enough data for a full-page operation, the controller waits for the next write command from the host at step 122.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A mass storage device comprising:
a storage media having,
a plurality of MRAM devices including a first NAND flash interface circuit;
a plurality of NAND flash memory devices (22) coupled to the MRAM devices via the first NAND flash interface circuit;
a hybrid reserved area spanning the plurality of NAND flash memory devices and the plurality of MRAM devices; and
a controller having a second NAND flash interface, the controller being coupled to the plurality of MRAM devices and the plurality of NAND flash memory devices through the first and second NAND flash interface circuits;
where the MRAM devices are used to store private data in the hybrid reserved area.

2. The mass storage device of claim 1, wherein the private data are tables.

3. The mass storage device of claim 1, wherein the private data is boot code.

4. The mass storage device of claim 1, wherein the private data are system data.

5. The mass storage device of claim 1, wherein the private data are Meta data.

6. The mass storage device of claim 1 further including a third NAND flash interface circuit included in the plurality of the NAND devices.

7. The mass storage device of claims 1 further including a hybrid user area spanning the plurality of NAND devices and the plurality of MRAM devices, wherein the hybrid user area is made of a user area NAND portion and a user area MRAM portion.

8. The mass storage device of claim 7 further wherein the controller is operable to:
responsive to a command to store data, at its convenience, finds an available physical location within the hybrid user area;

moves the host data from the MRAM portion to the hybrid user area;

and in the event there is no available physical location in the hybrid user area, performs 'garbage collection' to make available space for storing information in the hybrid user area prior to moving the data from the reserved area MRAM portion into the hybrid user area.

9. The storage media of claim 8, further wherein the controller is operable to, if data is to be read prior to having been moved to the hybrid user data, the controller accesses the data only from the hybrid reserved area.

10. A mass storage device including a memory media having plurality of MRAM devices with NAND flash interface and plurality of NAND flash memories coupled with MRAM devices via same interface, the mass storage device further including a controller having a host interface and NAND flash interface, coupled to the MRAM and NAND flash memory devices through the flash interface and coupled to a host through the host interface, wherein the controller uses the MRAM to cache a host data.

11. A storage media comprising:

a plurality of MRAM devices including a first NAND flash interface circuit;

a plurality of NAND flash memory devices coupled to the MRAM devices via the first NAND flash interface circuit;

a controller having a second NAND flash interface, the controller being coupled to the plurality of MRAM devices and the plurality of NAND flash memory devices through the first interface circuit; and hybrid user area spanning the plurality of NAND devices and plurality of MRAM devices, a portion of the a hybrid user area that spans the MRAM devices defining a MRAM portion, where the controller stores host-critical data in the MRAM portion of the hybrid user area.

12. The storage media of claim 11, wherein the host-critical data is Master Boot Record.

13. The storage media of claim 11, wherein the host-critical data is Partition Boot Record.

14. The storage media of claim 11, wherein the host-critical data are File allocation tables.

15. The storage media of claim 11, wherein the host-critical data are directories.

16. The storage media of claim 11 further including a third NAND flash interface circuit included in the plurality of the NAND devices.

17. The storage media of claims 11 further including a hybrid reserved area spanning the plurality of NAND devices and the plurality of MRAM devices, wherein the hybrid reserved area is made of a reserved area NAND portion and a reserved area MRAM portion.

18. The storage media of claims 17 further wherein the controller is operable to store user data in the reserved area MRAM portion.

19. The storage media of claims 18 wherein the controller is operable to move the stored user data from the reserved area MRAM portion to the user area.

20. The storage media of claim 19 further wherein upon no available physical location in the hybrid user area, the controller is operable to perform 'garbage collection' to make space available in the hybrid user area prior to moving the user data from the reserved area MRAM portion to the hybrid user area.

21. The storage media of claim 19, further wherein the controller is operable to, if user data is to be read prior to having been moved to the hybrid user area, the controller being operable to access the user data only from the reserved area MRAM portion.

22. The storage media of claim 17, wherein the controller is operable to collect enough user data, provided by the host, in reserved area MRAM portion to perform a NAND flash full page program operation in user area NAND portion.

23. The storage media of claim 22, further wherein the controller is operable to, if data is to be read prior to having been moved to user data NAND portion the controller being operable to access the user data only from the reserved area MRAM portion.

24. A method of writing user data comprising:

receiving user data to be written to a magnetic random access memory (MRAM) portion of a storage media that includes a hybrid reserved area spanning a NAND device and a MRAM device, the MRAM portion being a part of the MRAM device;

after indicating completion of receiving the user data, setting a pointer to locate space for storing the user data in the MRAM portion; and determining whether or not space is available in a hybrid user area that spans the MRAM device and the NAND device, if not, performing garbage collection and if so, moving the user data from the MRAM portion to the hybrid user area.

25. The method of claim 24 further including the step of re-adjusting the pointer after the moving step to point to the hybrid user area.

* * * * *